United States Patent
Choi et al.

(10) Patent No.: US 12,051,370 B2
(45) Date of Patent: Jul. 30, 2024

(54) POWER LINE DESIGN MODIFICATION TO MITIGATE VERTICAL BAND CROSSTALK

(71) Applicant: Google LLC, Mountain View, CA (US)

(72) Inventors: Sangmoo Choi, Palo Alto, CA (US); Chang Ju Kang, San Jose, CA (US); Jae Won Choi, Gangnam-gu (KR)

(73) Assignee: Google LLC, Mountain View, CA (US)

( * ) Notice: Subject to any disclaimer, the term of this patent is extended or adjusted under 35 U.S.C. 154(b) by 70 days.

(21) Appl. No.: 17/754,830

(22) PCT Filed: Feb. 2, 2021

(86) PCT No.: PCT/US2021/016212
§ 371 (c)(1),
(2) Date: Apr. 13, 2022

(87) PCT Pub. No.: WO2022/169440
PCT Pub. Date: Aug. 11, 2022

(65) Prior Publication Data
US 2023/0326409 A1    Oct. 12, 2023

(51) Int. Cl.
*H10K 59/131* (2023.01)
*G09G 3/3225* (2016.01)
(Continued)

(52) U.S. Cl.
CPC ......... *G09G 3/3258* (2013.01); *G09G 3/3225* (2013.01); *G09G 2300/0426* (2013.01);
(Continued)

(58) Field of Classification Search
CPC ............. G09G 3/3258; G09G 2300/08; G09G 2320/02; G09G 2320/0209;
(Continued)

(56) References Cited

U.S. PATENT DOCUMENTS

| 6,873,378 B2 | 4/2005 | Kai |
| 7,982,702 B2 | 7/2011 | Kamada et al. |
| (Continued) | | |

FOREIGN PATENT DOCUMENTS

| CN | 109817643 B * | 2/2021 |
| EP | 3660828 A1 | 6/2020 |
| (Continued) | | |

OTHER PUBLICATIONS

Office Action and Search Report, and translation thereof, from counterpart Taiwanese Application No. 110147955 dated Jul. 29, 2022, 6 pp.

(Continued)

*Primary Examiner* — Douglas M Wilson
(74) *Attorney, Agent, or Firm* — Shumaker & Sieffert, P.A.

(57) ABSTRACT

Techniques to provide uniform luminance across a computing device display, such as an active matrix organic light emitting diode (AMOLED) display. In some examples, a computing device display may include a hole within the active area of the display that may be used for a camera, a button or some other function. The hole may result in a non-uniform voltage drop in a power supply mesh in regions of the active area near the hole. The power supply mesh may provide electrical energy to elements of the display. The techniques of this disclosure include portions of the power supply mesh that are not connected to the voltage supply bus to ensure a uniform voltage drop across the active area of the display.

12 Claims, 7 Drawing Sheets

(51) Int. Cl.
  *G09G 3/3258* (2016.01)
  *H01L 23/522* (2006.01)
(52) U.S. Cl.
  CPC ..... *G09G 2300/08* (2013.01); *G09G 2320/02* (2013.01); *G09G 2320/0209* (2013.01); *G09G 2320/0223* (2013.01); *G09G 2320/0233* (2013.01); *G09G 2330/02* (2013.01); *G09G 2354/00* (2013.01); *H01L 23/5226* (2013.01); *H10K 59/131* (2023.02); *H10K 59/1315* (2023.02)
(58) Field of Classification Search
  CPC ... G09G 2320/0223; G09G 2320/0233; G09G 3/3225; G09G 2300/0426; G09G 2310/0232; G09G 2330/02; G09G 2354/00; H01L 23/5226; H10K 59/131; H10K 59/1315
  See application file for complete search history.

(56) References Cited

U.S. PATENT DOCUMENTS

| | | | |
|---|---|---|---|
| 8,803,862 | B2 | 8/2014 | Lee |
| 2019/0005883 | A1 | 1/2019 | Kim |
| 2020/0176526 | A1* | 6/2020 | Yoon ..................... H10K 59/88 |
| 2020/0273928 | A1 | 8/2020 | Che et al. |
| 2020/0294448 | A1 | 9/2020 | Heo et al. |
| 2020/0322467 | A1 | 10/2020 | Huh et al. |
| 2021/0066428 | A1* | 3/2021 | Tao ........................ H10K 71/00 |
| 2022/0165811 | A1* | 5/2022 | Yoon .................. H10K 59/1216 |

FOREIGN PATENT DOCUMENTS

| | | |
|---|---|---|
| TW | 200537205 A | 11/2005 |
| TW | 307074 B | 3/2009 |
| TW | 201218176 A | 5/2012 |
| WO | 2020199404 A1 | 10/2020 |

OTHER PUBLICATIONS

International Search Report and Written Opinion of International Application No. PCT/US2021/016212, dated Nov. 10, 2021, 12 pp.
Response to Communication Pursuant to Rules 161(1) and 162 EPC dated Jul. 5, 2023, from counterpart European Application No. 21707126.5, filed Dec. 20, 2023, 10 pp.

* cited by examiner

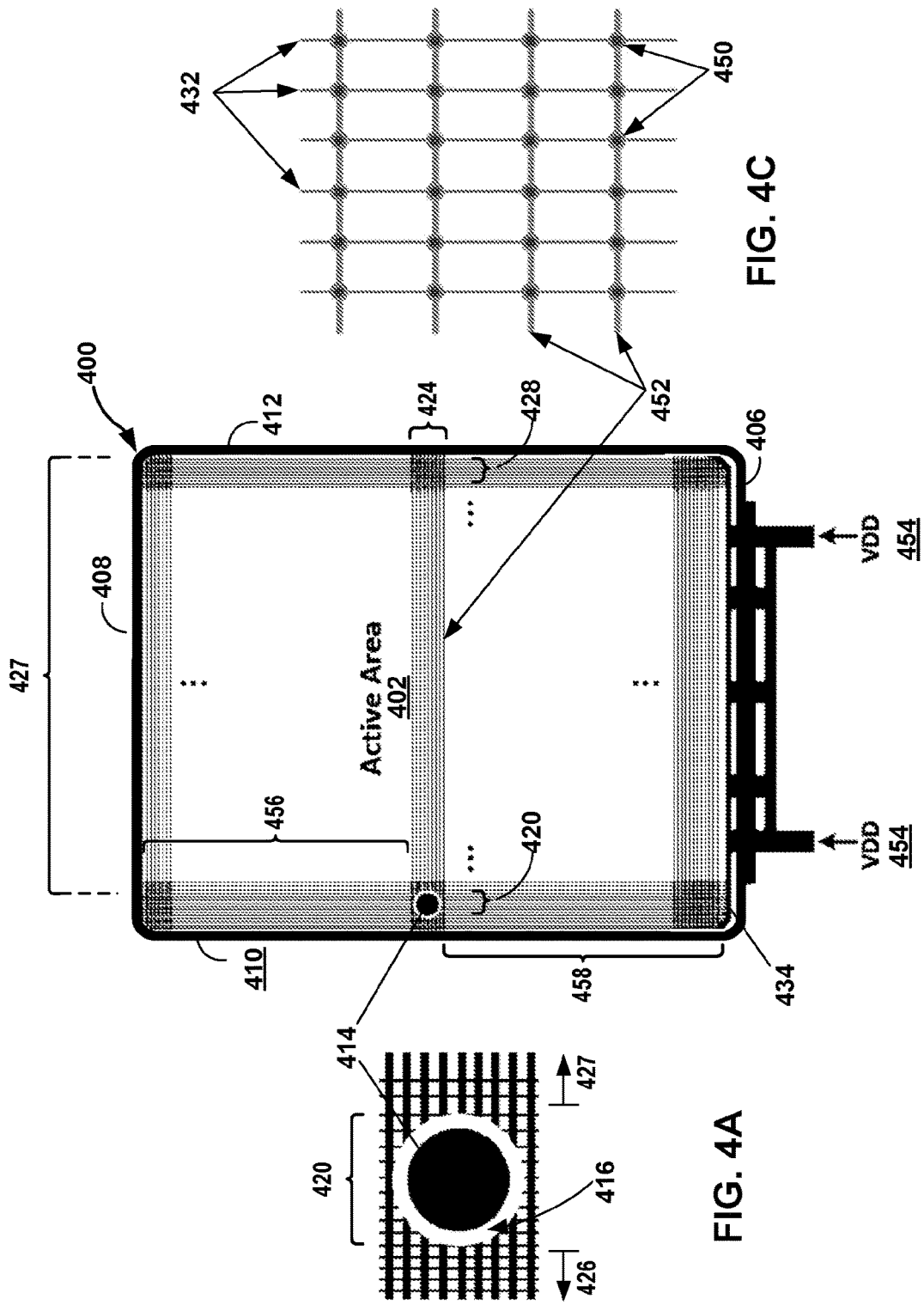

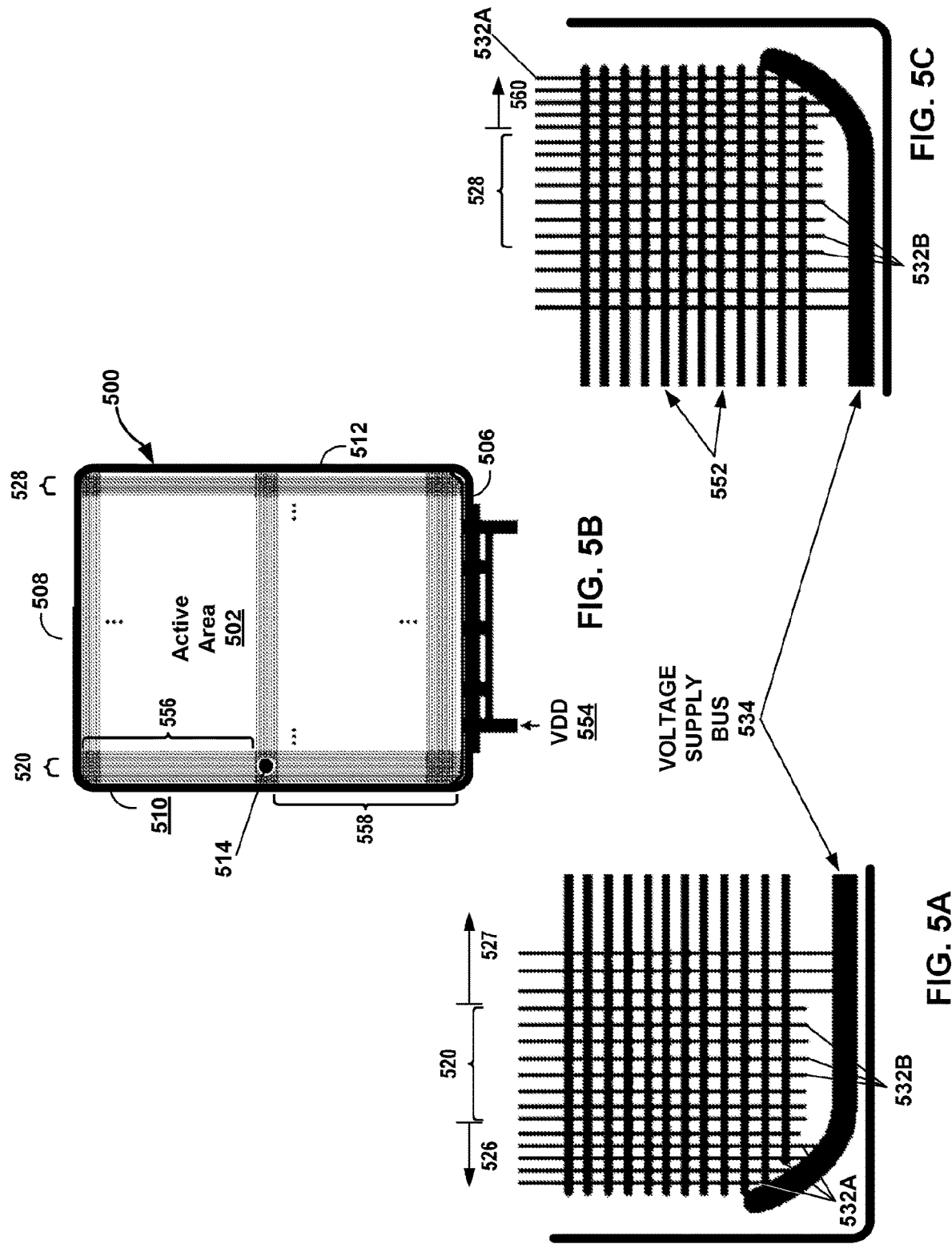

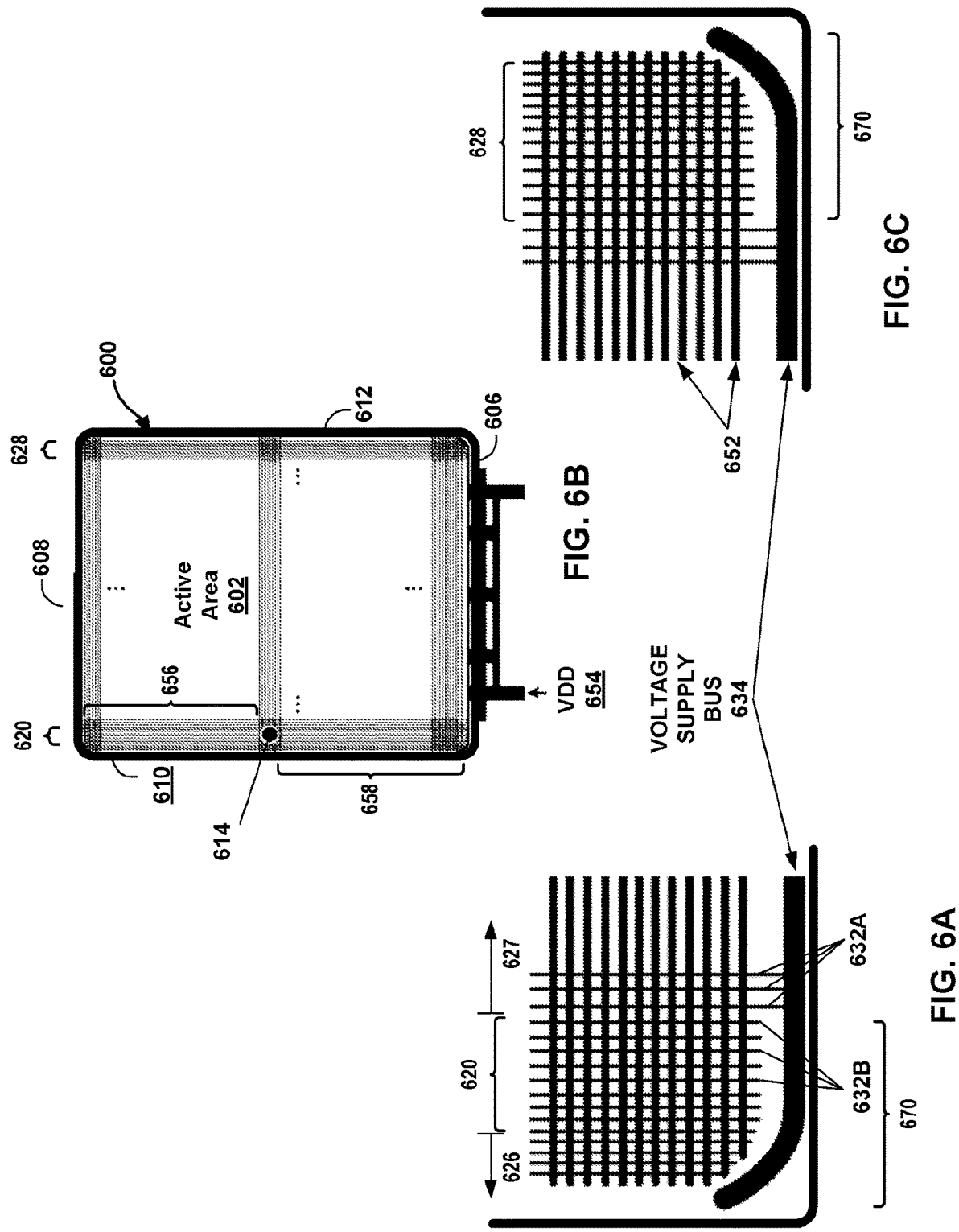

POWER LINE DESIGN MODIFICATION TO MITIGATE VERTICAL BAND CROSSTALK

This application is a national stage entry of WO International Patent Application No. PCT/US2021/016212, filed 2 Feb. 2021, the entire contents of which is incorporated herein by reference.

BACKGROUND

Computing devices may include display panels that form images. A display panel may contain an active area defined by an array of pixels that each include one or more light emitting elements configured generate light using electrical energy. In some examples a display panel may include a gap between an outline of the display panel and an outline of the display active area outline. This gap may be referred to as a bezel. The pixels may receive the electrical energy to generate the light from a power supply bus.

SUMMARY

In general, the disclosure describes display panels, such as an active-matrix organic light emitting diode (AMOLED) display panels, that provide uniform luminance. Pixels of an AMOLED display may receive electrical energy via a power supply mesh comprised of column and row traces. The column traces may be coupled to and receive the electrical energy from a voltage supply bus located at a first end of the display panel. In some examples, a display panel may include a window (e.g., a hole) defined by a window boundary within the active area of the display panel that may be used for a camera, a button or some other function. The window may result in a non-uniform voltage drop in the power supply mesh in regions of the active area near the hole (e.g., in regions between the window and the first end of the display panel). Such a non-uniform voltage drop may result in distortions in displayed images, which may not be desirable.

In accordance with one or more aspects of this disclosure, one or more of the column traces may be disconnected, e.g., not connected directly to the voltage supply bus. For instance, a sub-set of the column traces that intersect with the window may not be connected to the voltage supply bus. Instead, the sub-set of the column traces that are not connected to the voltage supply bus may receive electrical energy from the voltage supply bus via a circuit that includes other column traces and row traces. In this way, this disclosure enables a uniform voltage drop across the active area of the display device.

In one example, this disclosure describes a device comprising a display panel, the display panel includes a plurality of pixel circuits arranged into a matrix, the matrix including a window that does not include pixel circuits; a voltage supply bus positioned at an end of the display panel; a voltage supply grid configured to transport an electrical signal from the voltage supply bus to the plurality of pixel circuits, the voltage supply grid comprising a plurality of column traces and a plurality of row traces, wherein a first sub-set of the plurality of column traces are connected to the voltage supply bus, and wherein a second sub-set of the plurality of column traces are not connected to the voltage supply bus, the second sub-set of column traces including at least column traces aligned with the window; and one or more interconnections between column traces of the plurality of column traces and row traces of the plurality of row traces.

In another example, this disclosure describes a method of configuring a device comprising a display panel includes displaying, by a plurality of pixel circuits that are arranged into a matrix, an image, the matrix including a window that does not include pixel circuits; transporting, by a voltage supply bus and to a first sub-set of a plurality of column traces, an electrical signal; transporting, by the first sub-set of the column traces and to a plurality of row traces, the electrical signal; transporting, by the plurality of row circuits and to a second sub-set of the plurality of column traces, the electrical signal, wherein the second sub-set of column traces includes at least column traces aligned with the window, and wherein the plurality of column traces and the plurality of row traces form a voltage supply grid, transporting, by the voltage supply grid, the electrical signal to the plurality of pixel circuits.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 4A-4C are conceptual diagrams illustrating an example display panel with a voltage supply matrix and a window that may interrupt one or more traces of the voltage supply matrix.

FIGS. 5A-5C are conceptual diagrams illustrating an example voltage supply grid with a sub-set of column traces aligned with the window not connected to the voltage supply bus.

FIGS. 6A-6C are conceptual drawings illustrating an example voltage supply grid with a sub-set of column traces in a corner region of the display not connected to the voltage supply bus.

DETAILED DESCRIPTION

Figure 1:
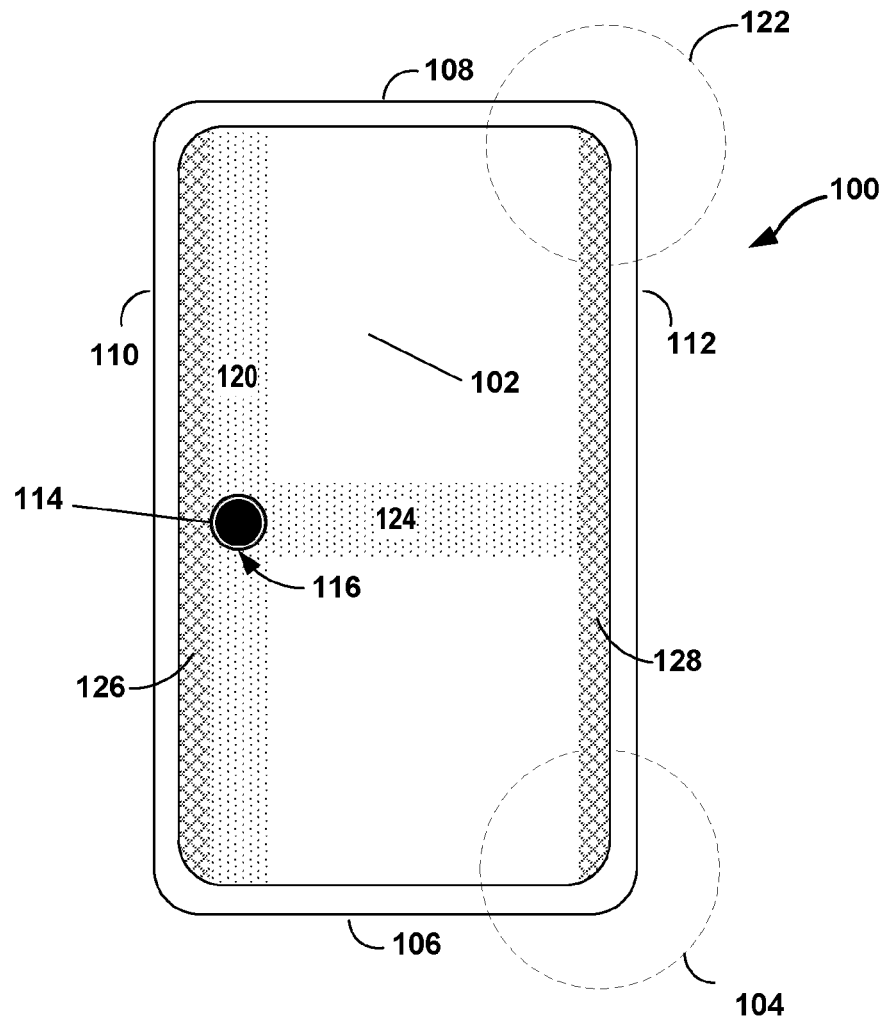
FIG. 1 is a conceptual diagram illustrating an example computing device with a display panel including a window in the active area.

FIG. 1 is a conceptual diagram illustrating an example computing device with a display panel including a window in the active area. As illustrated by the example of FIG. 1, a display panel 100 may include display panel active area 102, which may include rounded corner regions 104 and 122. Display panel 100 may be included in a computing device. Examples of such a computing device include, but are not limited to, a mobile phone, a camera device, a smart display, a tablet computer, a laptop computer, a desktop computer, a gaming system, a media player, an e-book reader, a television platform, a vehicle infotainment system or head unit, or a wearable computing device (e.g., a computerized watch, a head mounted device such as a VR/AR headset, computerized eyewear, a computerized glove). Examples of display panel 100 include, but are not limited to, liquid crystal displays (LCD), light emitting diode (LED) displays, organic light-emitting diode (OLED) displays, active matrix organic light emitting diode ("AMO-LED") displays, microLED displays, or similar monochrome or color displays capable of outputting visible information to a user of display panel 100.

As illustrated by the example of FIG. 1, the display panel active area 102 may include a first end 106, a second end 108, a first side 110, and a second side 112. Rounded corner region 104 may be located on or near the first end 106 of the display panel active area 102. For instance, as shown in FIG. 1, rounded corner region 104 may be located between first end 106 and second side 112. Although the example of FIG. 1 illustrates a display panel comprising first end 106, second end 108, first side 110, and second side 112, it should be apparent that techniques of this disclosure may also be applied to display panels having different geometries. For instance, the techniques of this disclosure are applicable to round display panels and display panels having more than two ends and/or two sides. Further, although the example of FIG. 1 illustrates rounded corner region 104 located between first end 106 and second side 112, it should be apparent that techniques of this disclosure may also be applied to a rounded corner region located between another end and another side of a display panel. For example, a rounded corner region may be located between the first end and the first side of the display panel, the second end and the first side of the display panel, and/or the second end and the second side of the display panel.

The display panel may include window 114 defined by window boundary 116. Window 114 may provide a space for a camera, a button, a sensor, such as a light sensor, or some other component. Window 114 may be located anywhere within display panel active area 102, e.g., as shown in the example of FIG. 1 near the middle of the first side 110. In other examples, window 114 may be located near one of the corners, in the center of display panel active area 102, including near a foldable section of display panel active area 102 (not shown in FIG. 1), or any other location.

One or more regions of display panel active area 102 may be defined with reference to window 114 (e.g., one or more regions may be defined as being aligned with window 114, such as region 120 and 124). Region 120 may extend from window 114 to first end 106 and second end 108. Region 124 may extend from window 114 to first side 110 and second side 112. Region 126 may be described as between region 120 aligned with window 114 and an edge of display panel 100 proximate to window 114, e.g., first side 110, in the example of FIG. 1. Region 128 may be described as a region symmetrically disposed proximate a side, e.g., side 112, of display panel 100 distal from window 114. As with region 120, regions 126 and 128 may extend from first end 106 to second end 108.

As discussed in further detail below, a display panel active area 102 may include an array of pixel circuits that are divided into rows and columns. Operation of the pixel circuits of this disclosure may be controlled using electrical signals relayed via a plurality of traces (e.g., pixel circuit traces or other conductive paths) built into display panel 100. A voltage supply bus may run perpendicular to the columns of pixel circuits and each of the column traces may connect directly to the voltage supply bus. However, pixel circuit traces that connect directly to the voltage supply bus may need to occupy a large amount of area in rounded corner region 104. In general, to accommodate these pixel circuit traces connected directly to the voltage supply bus, display panel bezel size, including the bezel size in rounded corner region 104, may be increased and/or the display corner curvature may be modified. However, increasing display panel bezel size and/or modifying the display corner curvature may be undesirable (e.g., due to aesthetic considerations).

In some examples, one or more column traces may be disconnected from the voltage supply bus, for example, in region 120, near curved region 104 or in other areas. Not connecting one or more column traces directly to the voltage supply bus may cause the electrical signal from the voltage supply bus to travel through one or more row traces and interconnections between row and column traces. In some examples, changing the routing of the electrical signal in this manner may avoid non-uniform luminance in some areas, for example, between region 126 and region 120.

To simplify the description, in this disclosure a "column" or column trace may be described as running from end 106 to end 108 and approximately parallel to sides 110 and 112. A "row" or row trace may be described as running from side 110 to side 112 and approximately parallel to ends 106 and 108 and approximately perpendicular to the columns. However, the rows and columns are just examples to explain the techniques of this disclosure. A user may rotate display panel 100 to any angle and therefore a column may not be vertical, yet still be considered a column and a row may not be horizontal, yet still be considered a row.

Figure 2:
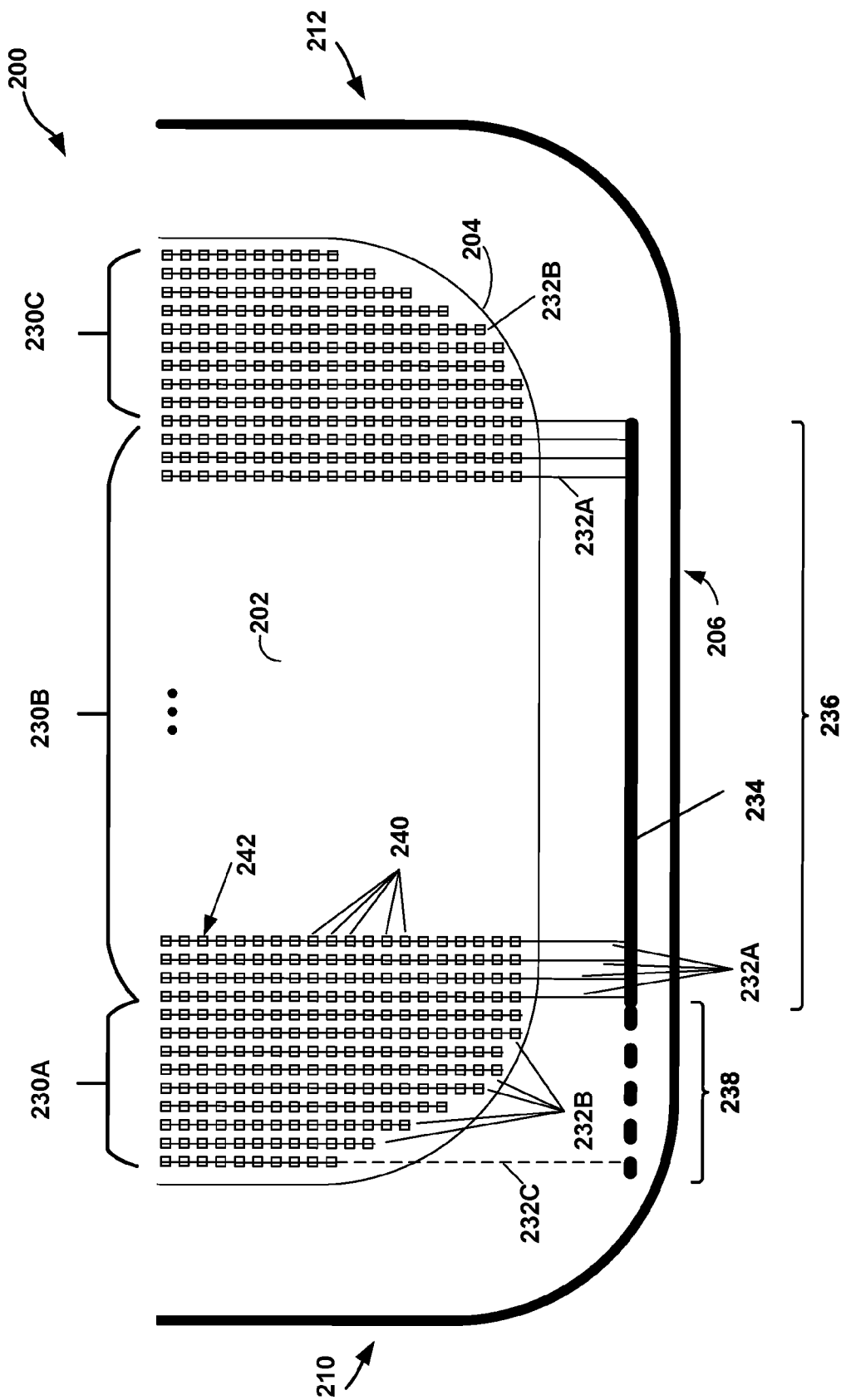
FIG. 2 is a conceptual diagram illustrating a display device with a plurality of rounded corner regions in accordance with aspects of this disclosure

FIG. 2 is a diagram illustrating an enlarged example of a display panel according to one or more techniques of this disclosure. Display panel 200 is an example of display panel 100 described above in relation to FIG. 1. End 206 is an example of first end 106, first side 210 is an example of first side 110 and second side 212 is an example of second side 112 and rounded corner region 204 is an example of rounded corner region 104 depicted in FIG. 1.

As illustrated by the example of FIG. 2, a display panel 200 may include a plurality of pixel circuits 242 and a voltage supply bus 234. The example of FIG. 2 shows pixel circuits 242 divided into three regions, 230A, 230B and 230C. Together, pixel circuits 242 may constitute display panel active area 202. Pixel circuits 242 are arranged in a plurality of columns and may receive electrical power via a plurality of column traces 232A and 232B, collectively described as column traces 232. Pixel circuits in region 230B may receive electrical power from column traces 232A that connect to (e.g., directly to) voltage supply bus 234. In the example of FIG. 2, pixel circuits in regions 230A and 230C may receive electrical power from column traces that are disconnected from (e.g., not directly connected to) voltage supply bus 234. In other examples, one or more column traces in regions 230A and/or 230C may connect to voltage supply bus 234, such as column trace 232C. In this disclosure the sub-set column traces 232A that connect to voltage supply bus 234 may be described as the first sub-set of the plurality of column traces. The sub-set column traces 232B that are not directly connected to voltage supply bus 234 may be described as the second sub-set of the plurality of column traces. Column traces 232B may be connected indirectly to voltage supply bus 234 via one or more row traces and interconnections.

In the example of FIG. 2, voltage supply bus 234 may defines a length 236 that extends along the first sub-set of column traces, 232A that connect to voltage supply bus 234. In other words, in some examples, column trace 232C may not connect to voltage supply bus 234, and length 238 of voltage supply bus 234 may be removed. Removing unnecessary portions of voltage supply bus 234 may offer advantages such as providing space in the bezel region of rounded corner regions, e.g., region 204, for other structures (e.g., signal/power lines, integrated row driver circuit, etc.), as well as allowing for the display panel bezel size to be desirably decreased.

Pixel circuits 242 are also arranged in a plurality of rows 240. In some examples, the pixel circuits are directly coupled to the column traces and receive power directly from the column traces. In other examples, the plurality of rows of pixel circuits may receive electrical power via a plurality of row traces (not shown in FIG. 2) on a separate layer from the layer of column traces. In some examples, the plurality of row traces make electrical connections between the column traces.

Figures 3A, 3B:
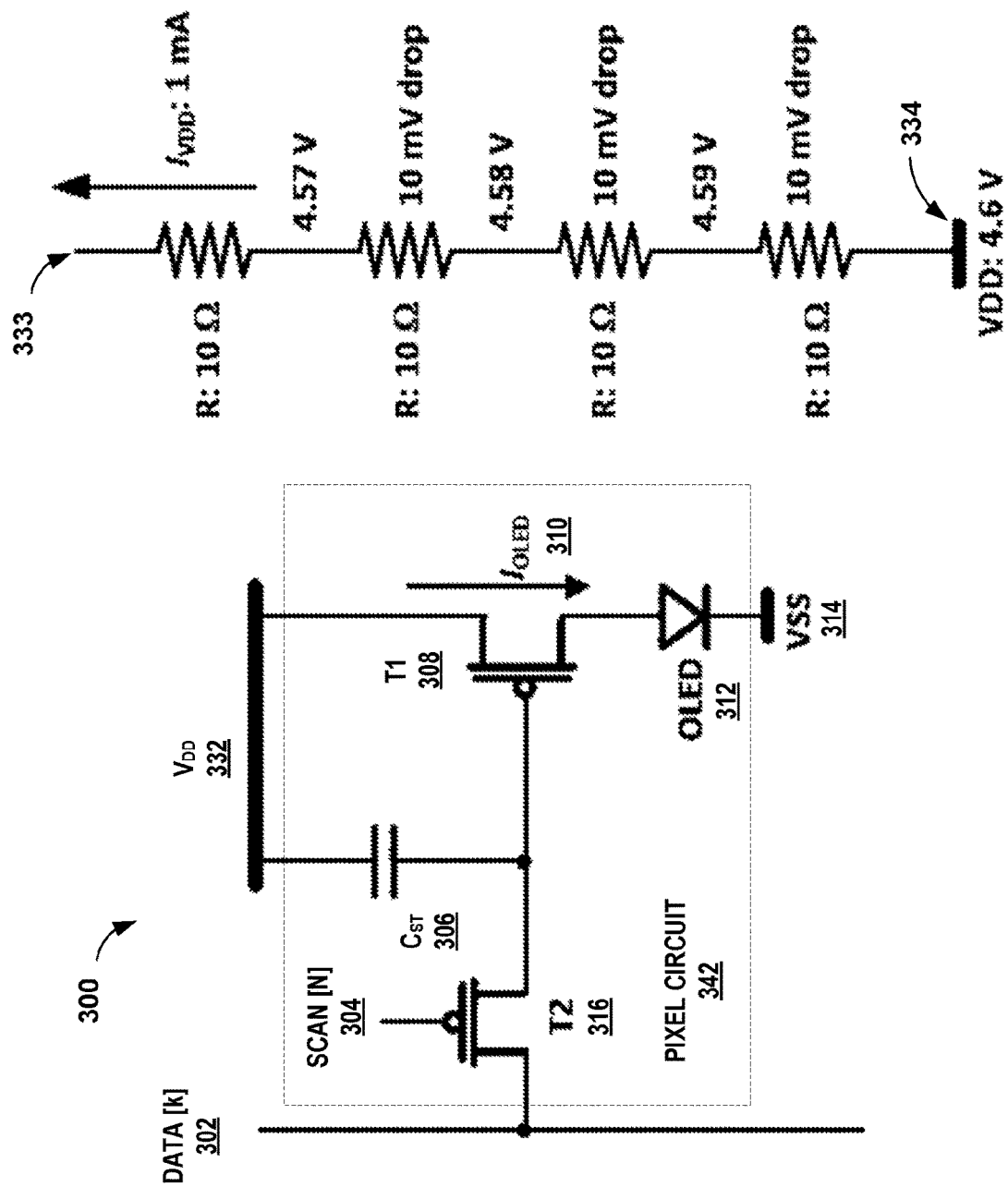
FIG. 3A is a schematic diagram illustrating an example pixel circuit that may be arranged in a matrix of pixel circuits.
FIG. 3B is a schematic diagram illustrating an example column trace of a voltage supply matrix with the traces between interconnections of the column trace modeled as resistors.

FIG. 3A is a schematic diagram illustrating an example pixel circuit that may be arranged in a matrix of pixel circuits. Pixel circuit 342 is an example of pixel circuit 242 of the plurality of pixel circuits in display panel 200 described above in relation to FIG. 2.

Pixel circuit 342 of circuit 300 may include OLED 312, with a cathode of OLED 312 connected to a reference line Vss 314 and an anode of OLED 312 connected to an output terminal of transistor T1 308. T1 308 is depicted as a P-type metal oxide semiconductor field effect transistor (MOSFET) in the example of FIG. 3A, but in other examples, may be implemented by another type of switch. T1 308 may control the current, $I_{OLED}$ 310, from a column trace that supplies power, Vdd 332, to OLED 312. The column trace with voltage Vdd 332 is an example of column traces 232A and 232B described above in relation to FIG. 2. In other examples pixel circuit 342 may receive power from a row trace, of one of rows 240 described above in relation to FIG. 2. Column traces and row traces of the display panel are the power supply mesh that may provide electrical energy to lighting elements, e.g., OLED 312 of pixel circuit 342. In this disclosure, the power supply mesh may also be referred to as a voltage supply grid, which may to transport an electrical signal from the voltage supply bus, e.g., voltage supply bus 234 depicted in FIG. 2, to the plurality of pixel circuits. The electrical signal is a power signal used by the plurality of pixel circuits to emit light.

The gate of T1 308 connects to an output terminal of transistor T2 316 as well as to Vdd 332 through capacitor Cst 306. An input terminal of transistor T2 316 connects to DATA[k] 302 and is controlled by SCAN[N] 304 connected to the gate of T2 316.

FIG. 3B is a schematic diagram illustrating an example column trace of a voltage supply bus with the traces between interconnections of the column trace modeled as resistors. Voltage supply bus 334 is an example of voltage supply bus 234 described above in relation to FIG. 2. Column trace 333 of FIG. 3B is an example of one of column traces 232A which connect to the voltage supply bus. The portions of the column trace that connect each pixel circuit in the column may cause a voltage drop, which in the example of FIG. 3B is modeled as a ten ohm (10Ω) resistor. Note that the values depicted in FIG. 3B are simply values selected for illustration. In other examples, the values may differ from those shown in FIG. 3B. The example one milliamp (mA) current may cause a one millivolt (mV) voltage drop between each pixel circuit.

FIGS. 4A-4C are conceptual diagrams illustrating an example display panel with a voltage supply matrix including a window that may interrupt one or more traces of the voltage supply matrix. Display panel 400 is an example of display panels 100 and/or 200 described above in relation to FIGS. 1 and 2.

As described for FIG. 1, in the example of FIGS. 4A and 4B, the display panel active area 402 may include a first end 406, a second end 408, a first side 410, and a second side 412. The display panel may include window 414 defined by window boundary 416. Window 414 may be located anywhere within display panel active area 402, e.g., as shown in the example of FIG. 4 near the middle of the first side 410. In other examples, window 414 may be located elsewhere in active area 402.

Display panel active area 402, first end 406, second end 408, first side 410, second side 412 and window 414 defined by window boundary 416 and column traces 432 are, respectively, examples of display panel active area 102 and/or 202, first end 106 and/or 206, second end 108, first side 110 and/or 210, second side 112 and/or 212, window 114, and column traces 232 described above in relation to FIGS. 1 and 2. As such, the characteristics and functions of display panel active area 402, first end 406, second end 408, first side 410, second side 412 and window 414 and column traces 432 may be similar or the same as the characteristics and functions of, respectively, display panel active area 102 and/or 202, first end 106 and/or 206, second end 108, first side 110 and/or 210, second side 112 and/or 212, window 114, and column traces 232.

Display panel 400 may also include a plurality of pixel circuits that include a lighting element configured to emit light, as described above in relation to FIG. 3. The pixel circuits (not shown in FIGS. 4A-4C) may be located at one or more interconnections 450 between column traces 432 of the plurality of column traces and row traces 452 of the plurality of row traces of the voltage supply grid of display panel 400 as shown in FIGS. 4B and 4C. As described above in relation to FIG. 2, column traces 432 may connect to a voltage supply bus 434. Voltage supply bus 434 may connect to power supply connection Vdd 454 to a power supply of a computing device that includes display panel 400 (not shown in FIGS. 4A-4C). Interconnections 450 may conduct the electrical signal from the voltage supply bus via column traces 432 to row traces 452. For column traces 432 not connected to voltage supply bus 434, interconnections 450 may conduct the electrical signal to the disconnected column traces 432 via row traces 452. In this manner, the pixel circuits may receive electrical power via either or both of row traces 452 and column traces 432 of the voltage supply grid.

In some examples, row traces 452 may be on a separate layer from the layer of column traces 432. The layer column traces 432 may be electrically isolated from the layer of row traces 452, except for interconnections 450. In some examples, horizontal Vdd lines, e.g., row traces 452, may have a relatively high sheet resistance compared to the column traces 432. Vertical Vdd lines, e.g., column traces 432, may have a relatively low sheet resistance when compared to the row traces 452. The reference layer, e.g., Vss 314 described above in relation to FIG. 3 may be a third layer electrically isolated from both the layer of row traces 452 and from the layer of column traces 432.

One or more regions of display panel active area 402 may be defined with reference to window 414. For example, regions may be aligned with window 414, such as region 420 and 424. Region 420 aligned with window 414 may extend from the window to first end 406 and second end 408. As described above in relation to FIG. 3B, column traces 432 may have a voltage drop for each pixel circuit starting from the connection to the voltage supply bus, e.g., near end 406 and extending along the column traces to end 408. For region 458, which may extend from the voltage supply bus to window 414 within region 420, the voltage drop for each pixel or interconnection 450 may be as shown for column trace 333 in FIG. 3. For region 456, which may be within region 420 between the interruption in the column traces caused by window 414 and end 408, the electrical signal may reach column traces in region 456 by first traveling through one or more of interconnections 450 and along one or more row traces 452, e.g., in region 424, before reconnecting to the column traces in 456 via an interconnection 450. Therefore, the voltage for each pixel circuit in region 456 may be different when compared to an adjacent pixel along a same row located in region 427. Region 427 may include column traces 432 from window 414 to side 412. Because the voltage for pixel circuit in different regions may be different, the display may perform differently in each region. For instance, light emitted by a pixel circuit within region 427 and an identically programmed pixel circuit within region 456 may be different.

In the example of FIGS. 4A and 4B, region 426 is between region 420 and an edge of display panel 400 proximate to window 414, e.g., first side 410. In some examples, column traces 432 in region 426 may connect to the voltage supply bus and therefore may have a similar voltage drop pattern to column traces 432 in regions 427 and 458. However, column traces 432 in region 456 may have a different voltage drop pattern because column traces 432 in region 456 are not directly connected to the voltage supply bus but receive power from one or more row traces 452 and interconnections 450. In some examples, processing circuitry (not shown in FIGS. 4A-4C) for a device using display panel 400 may perform complex algorithms to compensate for the different performance in the different regions.

In addition to non-uniform luminance caused by the discontinuity of column traces 432 in region 420 by window 414, display panel 400 may also be subject to pixel cross-talk. Some examples types of pixel cross-talk may include electrical or optical cross-talk. For example, pixel cross-talk may be caused by either or both of electrical or optical coupling between adjacent pixels in active area 402 of the display matrix. Electrical cross-talk may be caused by lateral current flow through common layers and optical cross-talk may be caused by light leakage through non-addressed pixels. In some examples, pixel cross-talk may reduce the contrast ratio and hampers the color range of the computing device display.

Other categories of cross-talk OLED display panel 400, may include "bright crosstalk" and "dark" crosstalk." In this disclosure, bright crosstalk refers to the phenomenon that the lit OLEDs on rows with more black (unlit) pixels (OLEDs) tend to be lit brighter than the lit OLEDs on rows with less black (unlit) pixels (OLEDs). Dark crosstalk refers to the opposite of bright crosstalk, i.e., the phenomenon that the lit OLEDs on rows with more black (unlit) pixels (OLEDs) tend to be lit darker than the lit OLEDs on rows with less black (unlit) pixels (OLEDs).

Bright crosstalk may be caused by the difference in the sink current of each row of the OLED display panel 400. Dark crosstalk may be caused by the difference in the amount of parasitic capacitances associated with the depending upon the display data for each row, e.g., display data received via data [k] 302 described above in relation to FIG. 3. The parasitic capacitance associated with an OLED of a pixel circuit, e.g., OLED 312, may be larger when the OLED is not lit than when the OLED is lit, because a conducting OLED may reduce the associated parasitic capacitance. A row with more OLEDs unlit may have a larger sum of parasitic capacitance than a row with fewer OLEDs unlit. Because the row with larger parasitic capacitance may have a larger time constant (R-C time constant) and therefore take longer to drive the OLEDs in a row with a larger time constant.

In the example of FIG. 4B, region 428 is a region symmetrically disposed proximate a side, e.g., side 412, of display panel 400 and distal from window 414. In some examples, region 428 may be symmetric with region 426 and therefore include approximately the same number of column traces 432 as are in region 426. When column traces in region 426 connect directly to the voltage supply bus, and column traces in region 428 connect directly to the voltage supply bus, then the pixel circuits connected to those column traces may have similar voltage drop characteristics to each other, as well as similar characteristics to column traces 432 in region 427. In other examples, region 428 may be symmetric with both regions 420 and 426. Developing compensation algorithms to provide uniform luminosity, and mitigate cross-talk, for display panel 400 with numerous different regions may be complex and result in long development time for testing, development, validation and production. In some examples, one or more column traces may be disconnected from the voltage supply bus, for example, in region 458, region 428, or in other areas. As described above in relation to FIGS. 1 and 2, disconnecting one or more column traces may cause the electrical signal from the voltage supply bus to travel through one or more row traces and interconnections between row and column traces. In some examples, changing the routing of the electrical signal in this manner may avoid non-uniform luminance in some areas.

FIGS. 5A-5C are conceptual diagrams illustrating an example voltage supply grid with a sub-set of column traces aligned with the window not connected to the voltage supply bus. Display panel 500 is an example of display panels 100, 200 and 400 described above in relation to FIGS. 1, 2 and 4 and may have the same functions and characteristics, unless otherwise noted.

The example of display panel 500 as shown in FIGS. 5A and 5B, includes active area 502, with window 514, regions 520, 556, 558 and 528 and power supply connection Vdd 554. As described above in relation to FIG. 4, region 520 includes a sub-set of column traces 532B that are aligned with window 514. In contrast to FIG. 4, and as described above in relation to FIG. 2, column traces 532B are a subset of column traces that do not directly connect to voltage supply bus 534. Column traces 532A in regions 526 and 527 connect directly to voltage supply bus 534. In display panel 500, by disconnecting column traces 532B in region 520 from voltage supply bus 534, the portions of column traces 532B in region 558 may be similar to column traces in region 556. As described above in relation to FIG. 4, column traces in region 558 are also within region 520 and are located between window 514 and voltage supply bus 534 at end 506. Column traces in region 556 are within region 520 and located between window 514 and end 508. Column traces within region 558, may have a similar voltage drop characteristic to column traces within region 556 because in both regions 556 and 558, the column traces may receive electrical power from voltage supply bus 534 via one or more row traces 552 and interconnections (not shown in FIGS. 5A-5C). In this manner, the techniques of this disclosure for display panel 500 may improve the luminance uniformity, when compared to display panel 400 described above in relation to FIG. 4. In other words, in contrast to display panel 400, display panel 500 may have fewer areas with different voltage drop characteristics and therefore may be less complicated to compensate for differences in active area 502. The techniques of this disclosure may also reduce the crosstalk issues as well as help to improve the luminance uniformity.

In some examples, display panel 500 may also include column traces 532B in region 528 that are not connected directly to voltage supply bus 534 but are rather connected indirectly to voltage supply bus 534 via one or more row traces and interconnections. Similar to region 428 described above in relation to FIG. 4, region 528 is a region symmetrically disposed to region 520 and proximate side 512 and distal from window 514. In display panel 500 region 528 is symmetric with region 520 and therefore include approximately the same number of column traces 532B as are in region 520. Column traces 532B in both regions 520 and 528 are in a subset of column traces that do not connect directly to voltage supply bus 534. Therefore, the pixel circuits connected to column traces 532B may have similar voltage drop characteristics in both regions 520 and 528, which may contribute to luminance uniformity in active area 502.

Similarly, column traces 532A in region 560 may be symmetric to column traces 532A in region 526, e.g., a subset of column traces directly connected to voltage supply bus 534 and disposed proximate to a side of display panel 500. Therefore, the column traces, both subset 532A and subset 532B, along side 510 may have similar characteristics to column traces along side 512. The pixel circuits connected to these column traces in regions 526, 520, 528 and 560 may have similar voltage drop characteristics to each other and may contribute to uniform luminosity for active area 502.

FIGS. 6A-6C are conceptual drawings illustrating an example voltage supply grid with a sub-set of column traces in a corner region of the display not connected to the voltage supply bus. Display panel 600 is an example of display panels 100, 200, and 400 described above in relation to FIGS. 1, 2, and 4 and may have the same functions and characteristics, unless otherwise noted.

The example of display panel 600 as shown in FIGS. 6A and 6B, includes active area 602, with window 614, regions 620, 656, 658, and 628 and power supply connection Vdd 654 at end 606 and opposite to end 608. As described above in relation to FIG. 5, region 620 includes a sub-set of column traces 632B that are aligned with window 614. In contrast to FIG. 4, and as described above in relation to FIG. 2, column traces 632B are a subset of column traces that do not directly connect to voltage supply bus 634. Column traces 632A in regions 626 and 627 connect directly to voltage supply bus 634. As described above in relation to FIG. 5, for display panel 600, by not connecting column traces 632B in region 620 to voltage supply bus 634, the portions of column traces 632B in region 658 may be similar to column traces in region 656. Therefore, column traces within region 658, may have a similar voltage drop characteristic to column traces within region 656 because in both regions 656 and 658, the column traces may receive electrical power from voltage supply bus 634 via one or more row traces 652 and interconnections (not shown in FIGS. 6A-6C).

In addition, for display panel 600, the subset of column traces 632B that are disconnected from voltage supply bus 634 may include those column traces in region 626. Similar to regions 426 and 526 described above in relation to FIGS. 4 and 5, region 626 includes column traces located between the column traces aligned with window 414 in region 620 and side 610 of display panel 600 proximate to window 614. However, in contrast to the column traces in regions 426 and 526, column traces 632B in region 626 are included in the sub-set of the plurality of column traces that are not connected to voltage supply bus 634.

In this manner, the techniques of this disclosure for display panel 600 may improve the luminance uniformity, when compared to display panel 400 described above in relation to FIG. 4. In other words, in contrast to display panel 400, display panel 600 may have fewer areas with different voltage drop characteristics and therefore may be less complicated to compensate for differences in active area 602. Disconnecting the column traces in region 626 may also result in fewer regions of display panel 600 with different voltage drop characteristics when compared to display panel 500. Similar to display panel 500, the techniques of this disclosure as described for FIGS. 6A-6C may also reduce the crosstalk issues as well as help to improve the luminance uniformity.

As described above in relation to FIG. 5C, in some examples, display panel 600 may also disconnect column traces 532B in region 528. Region 628 is a region symmetrically disposed to the combined regions 626 and 620, proximate side 612 and distal from window 614. In display panel 500 region 528 is symmetric with region 520 and therefore include approximately the same number of column traces 532B as are in region 520. As noted above, column traces 632B in regions 620, 626 and 628 are in a subset of column traces that do not connect directly to voltage supply bus 634. Therefore, the pixel circuits connected to column traces 632B may have similar voltage drop characteristics in regions 620, 626 and 628, which may contribute to luminance uniformity in active area 602.

In the example of FIGS. 6A and 6C, the portion of voltage supply bus 634 indicated by 670 does not connect to any column traces. Therefore, voltage supply bus 634 does not need to extend towards the side 610 or side 612 beyond the last connected column trace 632A. In some examples, portion 670 of voltage supply bus 634 may be removed from the corner regions, which may help to reduce the display corner bezel width. In some examples, removing portion 670 may provide space near the rounded corner region for other signal lines, or other components. In other words, portion 670, which is proximate to column traces of the plurality of column traces located between the column traces aligned with window 614, e.g., column traces in region 620, and side 610 of the display panel proximate to window 614 may be removed from voltage supply bus 634. Without portion 670 near side 610 and near side 612, voltage supply bus 634 defines a length that extends along the sub-set of column traces 632A that connect to voltage supply bus 634.

Figure 7:
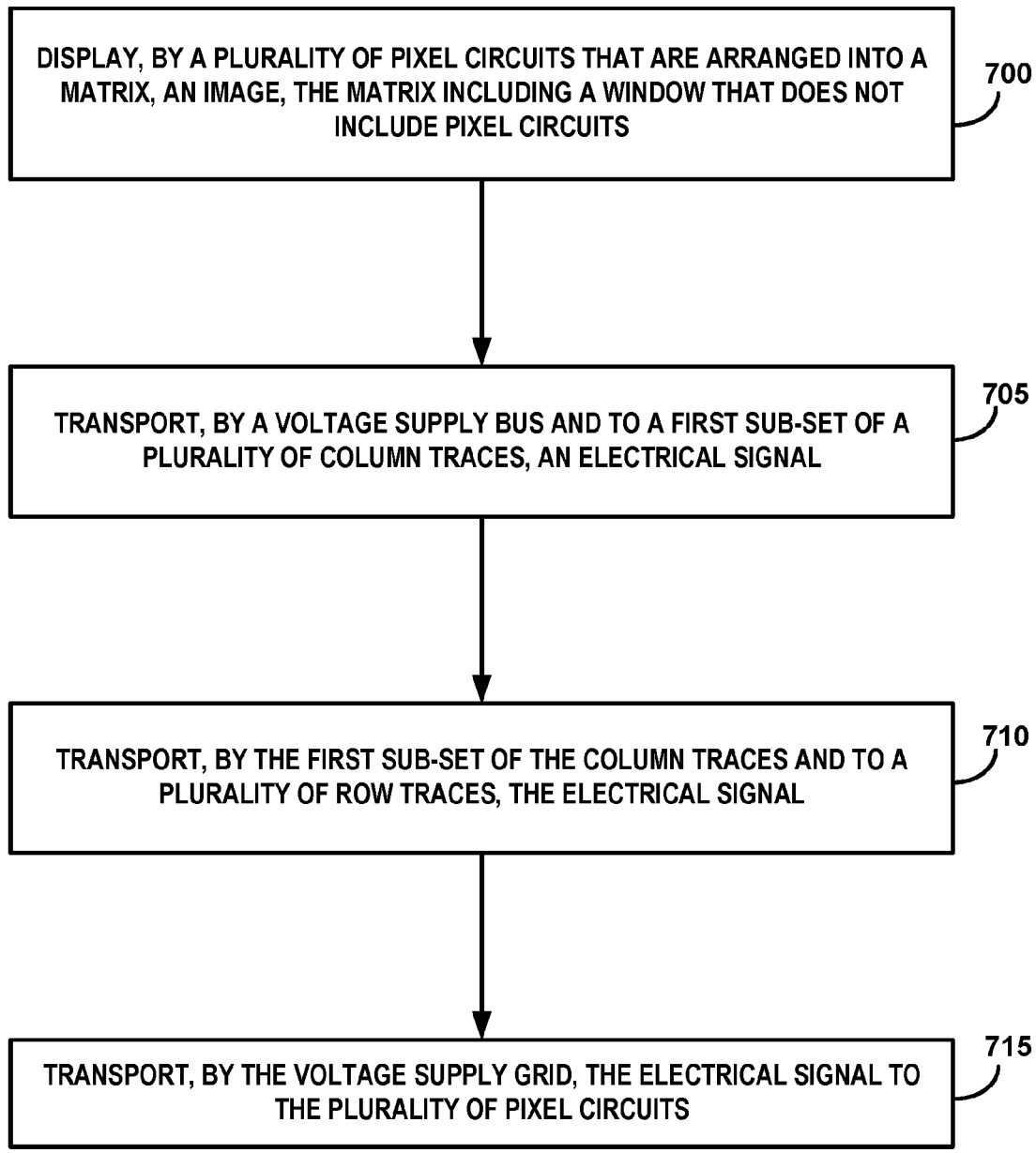
FIG. 7 is a flow chart illustrating an example operation of the display device of this disclosure.

FIG. 7 is a flow chart illustrating an example operation of the display device of this disclosure. The blocks of FIG. 7 will be described in terms of FIGS. 5A-5C, unless otherwise noted.

As seen in the example of FIG. 7, a plurality of pixel circuits that are arranged into a matrix, e.g., as shown in FIG. 2, may be configured to display an image on active area 502 of display panel 500 (700). The image may include colors, text, control features, graphical user interface elements, and so on. The matrix of pixel circuits may include window 514 that does not include pixel circuits. As noted above, window 514 may be included so as to enable a sensor, such as a camera, to capture light through display panel 500.

Voltage supply bus 534 may transport an electrical signal, e.g., electrical power to the sub-set of column traces 532A connected to voltage supply bus 534 (705). As described above in relation to FIG. 4, the sub-set of column traces 532A may further conduct the electrical signal via interconnections 450 and row traces 452 to other pixel circuits (710). In other words, the voltage supply grid of display panel 500, which may comprise multiple layers, may conduct the electrical signal to the plurality of pixel circuits (715).

The disclosure may also be described by the following examples

Example 1: A device comprising a display panel, the display panel includes a plurality of pixel circuits arranged into a matrix, the matrix including a window that does not include pixel circuits; a voltage supply bus positioned at an end of the display panel; a voltage supply grid configured to transport an electrical signal from the voltage supply bus to the plurality of pixel circuits, the voltage supply grid comprising a plurality of column traces and a plurality of row traces, wherein a first sub-set of the plurality of column traces are connected to the voltage supply bus, and wherein a second sub-set of the plurality of column traces are not connected to the voltage supply bus, the second sub-set of column traces including at least column traces aligned with the window; and one or more interconnections between column traces of the plurality of column traces and row traces of the plurality of row traces.

Example 2: The device of example 1, wherein the second sub-set of column traces further includes column traces of the plurality of column traces located between the column traces aligned with the window and an edge of the display panel proximate to the window.

Example 3: The device of example 2, wherein the voltage supply bus defines a length that extends along the first sub-set of column traces.

Example 4: The device of example 2, wherein a portion of the voltage supply bus is removed proximate to column traces of the plurality of column traces located between the column traces aligned with the window and an edge of the display panel proximate to the window.

Example 5: The device of example 1, wherein the second sub-set of column traces includes column traces of the plurality of column traces that are symmetrically disposed column traces proximate a side of the display panel distal from the window.

Example 6: The device of example 1, wherein the electrical signal is a power signal used by the plurality of pixel circuits to emit light.

Example 7: The device of example 1, the device further comprising a camera configured to capture images via the window.

Example 8: The device of example 1, wherein the voltage supply grid comprises a first layer and a second layer, wherein the first layer comprises the plurality of column traces, and wherein the second layer comprises the plurality of row traces.

Example 9: The device of example 8, wherein the first layer defines a first sheet resistance, and the second layer defines a second sheet resistance, and wherein the first sheet resistance is less than the second sheet resistance.

Example 10: The device of example 8, wherein the first layer is electrically isolated from the second layer, except for the one or more interconnections between column traces of the plurality of column traces and row traces of the plurality of row traces.

Example 11: A method of configuring a device comprising a display panel includes displaying, by a plurality of pixel circuits that are arranged into a matrix, an image, the matrix including a window that does not include pixel circuits; transporting, by a voltage supply bus and to a first sub-set of a plurality of column traces, an electrical signal; transporting, by the first sub-set of the column traces and to a plurality of row traces, the electrical signal; transporting, by the plurality of row circuits and to a second sub-set of the plurality of column traces, the electrical signal, wherein the second sub-set of column traces includes at least column traces aligned with the window, and wherein the plurality of column traces and the plurality of row traces form a voltage supply grid, transporting, by the voltage supply grid, the electrical signal to the plurality of pixel circuits.

Example 12: The method of example 11, further comprising capturing, by a camera and via the window, one or more images.

Example 13: The method of example 11, wherein the first sub-set of column traces are directly connected to the voltage supply bus, and wherein the second sub-set of column traces are not directly connected to the voltage supply bus.

Various examples of the disclosure have been described. These and other examples are within the scope of the following claims.

What is claimed is:

1. A device comprising a display panel, the display panel comprising:
   a plurality of pixel circuits arranged into a matrix, the matrix including a window that does not include pixel circuits;
   a voltage supply bus positioned at a first end of the display panel;
   a voltage supply grid configured to transport an electrical signal from the voltage supply bus to the plurality of pixel circuits, the voltage supply grid comprising a plurality of column traces and a plurality of row traces, wherein a first sub-set of the plurality of column traces are directly connected to the voltage supply bus, wherein a second sub-set of column traces includes all of the column traces which are aligned with the window, wherein column traces of the second sub-set of the plurality of column traces include first portions between the window and the first end and second portions between the window and a second end that is opposite the first end, and wherein neither the first portions nor the second portions of the second sub-set of the plurality of column traces are directly connected to the voltage supply bus; and
   one or more interconnections between column traces of the plurality of column traces and row traces of the plurality of row traces, wherein the second sub-set of the plurality of column traces are indirectly connected to the voltage supply bus via the first sub-set of the plurality of column traces and the row traces.

2. The device of claim 1, wherein the second sub-set of column traces further includes column traces of the plurality of column traces located between the column traces aligned with the window and an edge of the display panel proximate to the window.

3. The device of claim 1, wherein the voltage supply bus defines a length that extends along the first sub-set of column traces.

4. The device of claim 1, wherein a portion of the voltage supply bus is removed proximate to column traces of the plurality of column traces located between the column traces aligned with the window and an edge of the display panel proximate to the window.

5. The device of claim 1, wherein the second sub-set of column traces includes column traces of the plurality of column traces that are symmetrically disposed column traces proximate a side of the display panel distal from the window.

6. The device of claim 1, wherein the electrical signal is a power signal used by the plurality of pixel circuits to emit light.

7. The device of claim 1, the device further comprising a camera configured to capture images via the window.

8. The device of claim 1,
wherein the voltage supply grid comprises a first layer and a second layer,
wherein the first layer comprises the plurality of column traces, and
wherein the second layer comprises the plurality of row traces.

9. The device of claim 8,
wherein the first layer defines a first sheet resistance, and the second layer defines a second sheet resistance, and
wherein the first sheet resistance is less than the second sheet resistance.

10. The device of claim 8, wherein the first layer is electrically isolated from the second layer, except for the one or more interconnections between column traces of the plurality of column traces and row traces of the plurality of row traces.

11. A device comprising a display panel, the display panel comprising:
a plurality of pixel circuits arranged into a matrix, the matrix including a window that does not include pixel circuits;
a voltage supply bus positioned at an end of the display panel;
a voltage supply grid configured to transport an electrical signal from the voltage supply bus to the plurality of pixel circuits, the voltage supply grid comprising a plurality of column traces and a plurality of row traces, wherein a first sub-set of the plurality of column traces are directly connected to the voltage supply bus, wherein a second sub-set of column traces includes all of the column traces which are aligned with the window, and wherein a portion of the voltage supply bus is removed proximate to column traces of the plurality of column traces located between the column traces aligned with the window and an edge of the display panel proximate to the window; and
one or more interconnections between column traces of the plurality of column traces and row traces of the plurality of row traces, wherein the second sub-set of the plurality of column traces are indirectly connected to the voltage supply bus via the first sub-set of the plurality of column traces and the row traces.

12. A device comprising a display panel, the display panel comprising:
a plurality of pixel circuits arranged into a matrix, the matrix including a window that does not include pixel circuits;
a voltage supply bus positioned at an end of the display panel;
a voltage supply grid configured to transport an electrical signal from the voltage supply bus to the plurality of pixel circuits, the voltage supply grid comprising a plurality of column traces and a plurality of row traces, wherein a first sub-set of the plurality of column traces are directly connected to the voltage supply bus, and wherein a second sub-set of column traces includes all of the column traces which are aligned with the window, wherein:
the voltage supply grid comprises a first layer and a second layer,
the first layer defines a first sheet resistance,
the second layer defines a second sheet resistance, wherein the first sheet resistance is less than the second sheet resistance,
the first layer comprises the plurality of column traces, and
the second layer comprises the plurality of row traces; and
one or more interconnections between column traces of the plurality of column traces and row traces of the plurality of row traces, wherein the second sub-set of the plurality of column traces are indirectly connected to the voltage supply bus via the first sub-set of the plurality of column traces and the row traces.

* * * * *